United States Patent
Maniloff et al.

(10) Patent No.: US 7,467,056 B2
(45) Date of Patent: Dec. 16, 2008

(54) METHOD AND APPARATUS FOR ALIGNING MULTIPLE OUTPUTS OF AN FPGA

(75) Inventors: Eric Maniloff, Stittsville (CA); Ronald Gagnon, Nepean (CA); Blake Toplis, Ottawa (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 0 days.

(21) Appl. No.: 11/716,187

(22) Filed: Mar. 9, 2007

(65) Prior Publication Data

US 2008/0222594 A1    Sep. 11, 2008

(51) Int. Cl.
*H04B 13/00* (2006.01)
(52) U.S. Cl. .................. 702/107; 375/219; 375/354; 713/401
(58) Field of Classification Search .................. 326/38; 370/216, 230.1, 242, 470, 536, 514; 714/700; 375/354, 358, 368, 371; 713/400, 401, 503
See application file for complete search history.

(56) References Cited

U.S. PATENT DOCUMENTS

| | | | | |
|---|---|---|---|---|
| 6,167,077 | A * | 12/2000 | Ducaroir et al. ............. | 375/219 |
| 6,999,891 | B2 | 2/2006 | Pepper | |
| 7,036,037 | B1 * | 4/2006 | Paul et al. .................. | 713/401 |
| 7,170,907 | B1 * | 1/2007 | Reches ....................... | 370/516 |
| 2004/0252684 | A1 * | 12/2004 | Evans et al. ................. | 370/389 |
| 2004/0264613 | A1 * | 12/2004 | Buchmann et al. .......... | 375/354 |

OTHER PUBLICATIONS

Serdes Framer Interface Level 5 (SFI-5) Implementation Agreement for 40GB/s Interface for Physical Layer Devices (IOF-SFI5-01.02), Jan. 29, 2002.
IA Title: Serdes Framer Interface Level 5 Phase 2 (SFI-5.2): Implementation Agreement for 40GB/s Interface for Physical Layer Devices (IOF-SFI5-02), Oct. 2, 2006.

* cited by examiner

*Primary Examiner*—Eliseo Ramos Feliciano
*Assistant Examiner*—Mi'schita' Henson
(74) *Attorney, Agent, or Firm*—Anderson Gorecki & Manaras LLP

(57) ABSTRACT

Each data lane connected to a FPGA and forming part of a SFI channel may be trained independently to enable the outputs from the FPGA to be aligned. In operation, a known fixed pattern is repeated on each of the data lanes with the exception of the data lane being trained. The short fixed pattern is smaller than an SERDES capture range so that the SERDES may temporarily lock onto the short fixed pattern for all data lanes other than the lane being trained. Training data is then transmitted on the lane being trained and the preskew delay for that lane is adjusted until the receiving component indicates that the lanes are aligned. This process may iterate to find acceptable preskew delay values for all lanes. By training the lanes one at a time and using a short repeating pattern on the untrained lanes, the SERDES may register that the untrained lanes are operating correctly so that the feedback from the SERDES is related only to the lane being trained.

15 Claims, 6 Drawing Sheets

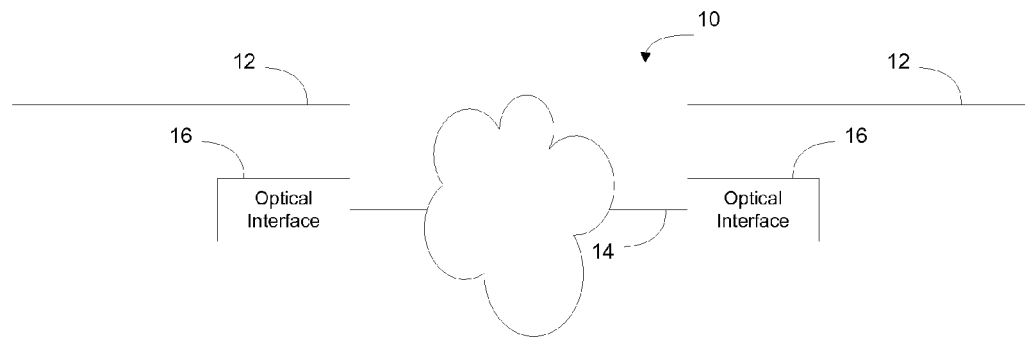
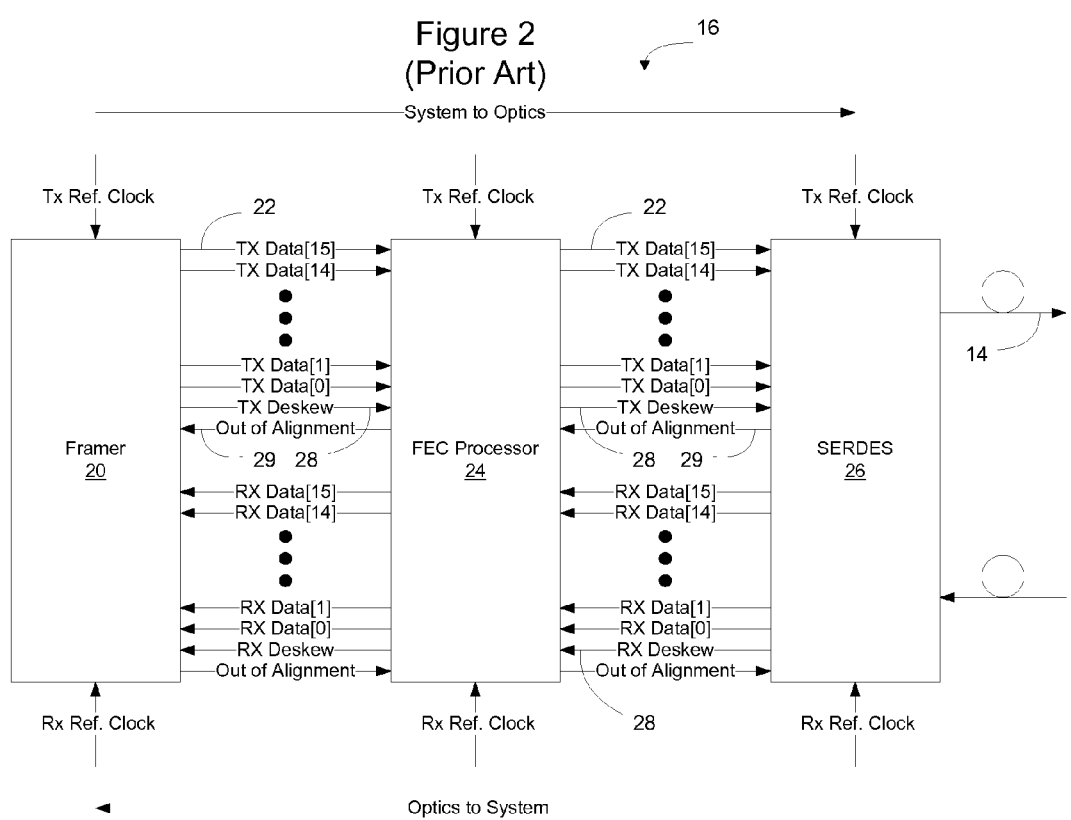

METHOD AND APPARATUS FOR ALIGNING MULTIPLE OUTPUTS OF AN FPGA

BACKGROUND OF THE INVENTION

1. Field of the Invention

The present invention relates to optical interfaces and, more particularly, to a method and apparatus for aligning multiple SERDES outputs of an FPGA.

2. Description of the Related Art

Data communication networks may include various computers, servers, nodes, routers, switches, bridges, hubs, proxies, and other network devices coupled to and configured to pass data to one another. These devices will be referred to herein as "network elements." Data is communicated through the data communication network by passing protocol data units, such as Internet Protocol packets, Ethernet Frames, data cells, segments, or other logical associations of bits/bytes of data, between the network elements by utilizing one or more communication links between the network elements. A particular protocol data unit may be handled by multiple network elements and cross multiple communication links as it travels between its source and its destination over the network.

Optical fibers are commonly used to implement communication links. To communicate using an optical fiber, light is modulated at one end of the fiber and the modulated light is detected at the other end. Different wavelengths may be used simultaneously, so that multiple signals may be carried on the same fiber. FIG. 1 shows an example optical network 10 in which network elements 12 are connected to opposite ends of a link 14. Optical interfaces 16 on the network elements transmit and receive data over the optical link 14.

As shown in FIG. 1, a network element will use an optical interface to transmit light onto the optical fiber. As transmission speeds have increased over time, the manner in which the optical interfaces are implemented has likewise changed. For example, it is now possible to transmit 40 Gb/s (OC768/STM-256 or OTU-3) on a given wavelength. To enable the optical interface to transmit this much data, the data may be transmitted between the components forming the optical interface using multiple lower speed channels, and then multiplexed into a single data stream prior to transmission onto the optical fiber.

FIG. 2 shows an example optical interface that may be used to transmit data onto an optical fiber. As shown in FIG. 2, an optical interface generally includes a framer 20 configured to frame data for transmission over multiple data channels 22. The data from the framer is passed through a Forward Error Correction (FEC) processor 24, and then is passed to a serializer/deserializer (SERDES) 26 configured to multiplex the data from the multiple data channels 22 onto an optical fiber 14. Additional details associated with an optical interface of this nature are provided in the SERDES-Framer Interface standard SFI-5, the content of which is hereby incorporated by reference. Other SFI standards exist as well and embodiments of the invention may be adapted to use with those other standards as well. The SFI-5 standard specifies the manner in which the data is to be transmitted on the data channels 22 between the components of the optical interface, such as between the framer and FEC processor, between the FEC processor and the SERDES, and/or between the framer and SERDES. The optical interface in this example supports bidirectional flow of data from the network element to the optics, and from the optics to the network element. The SFI-5 standard may be used to enable communications between the components of the optical interface in both directions.

As shown in FIG. 2, the SFI standard describes a way in which the entire serial optical data stream can be broken down into multiple, lesser rate electrical streams in order to be delivered from one component to the next. These multiple deserialized electrical streams will hereafter be referred to as data lanes or channels. One aspect of the SFI-5 standard is that the data lanes need to be aligned with each other to within a particular tolerance level, so that the receiver is able to correctly extract data from the data lanes. Specifically, the standard specifies that the several data lanes must be aligned to within five Unit Intervals (UI or bits). Although the term "Unit Interval or UI" will be used in connection with alignment of the data lanes so that the language used herein comports with the language used in the SFI-5 standard, the invention is not limited to use in connection with an implementation of that standard. Thus, other alignment values or tolerance levels may be used in other contexts.

To enable the components to determine whether the data lanes are properly aligned, a deskew channel 28 is provided for each set of sixteen data lanes. In operation, the deskew channel is used to transmit a portion of the data from each of the data channels, in turn, that has been sampled at a particular defined time. The receiving component uses this replicated data on the deskew channel to look for the same data on each of the data lanes, in turn, at an expected time. It then uses the measured skew between the data lane and the deskew channel to bring the data lane into alignment with the deskew lane; this receiver operation is referred to as deskewing the data lane. If the receiving component is not able to find the same data on the data channel as was supplied on the deskew channel, the receiving component may infer that the delay on the data channel exceeds its capability to deskew and that the data channel is out of alignment. Since the deskew channel contains data for each data lane (one after another) the receiving component is able to check each data channel to make sure each data channel it is aligned properly. The range within which the SERDES is able to deskew the data will be referred to herein as the capture range. The capture range is typically 2N unit intervals in length (+/-N symbols) from the deskew channel; that is to say that if a data lane's pattern is skewed by less than -N to +N symbol periods from the replicated data on the deskew channel, then the data lane can be deskewed.

The receiving component has an out of alignment alarm 29 that is used to provide feedback when one or more of the data channels is out of alignment. Specifically, if the receiving component determines that one of the data channels 22 is out of alignment, it will indicate this to the transmitting component using an out of alignment alarm. The SFI-5 standard requires a single out of alignment alarm to be provided which indicates that one or more of the data lanes can not be appropriately deskewed. However, there are 16 data channels in the SFI standard, and the alarm is used to indicate that at least one of them is out of alignment without indicating the particular lane that is determined to be out of alignment. Thus, determining which of the lanes is out of alignment may not be trivial.

For cost reasons, it may be advantageous to implement one or more of the components of an optical interface using a Field Programmable Gate Array (FPGA) rather than using an Application Specific Integrated Circuit (ASIC). Additionally, using a FPGA may be more versatile than using an ASIC, since many FPGAs are able to be reprogrammed if necessary to update the logic implemented therein. Unfortunately, the available FPGAs, such as FPGAs available from Altera™ and Xilinx™, generally are only able to achieve an inter-lane alignment of approximately 40 unit intervals, which is well in excess of the maximum inter-lane alignment requirements of 5 unit intervals set by the current implementation of the SFI 5 standard.

SUMMARY OF THE INVENTION

A method and apparatus for aligning multiple outputs of an FPGA enables a framer implemented using the FPGA to meet the SERDES Framer Interface (SFI-5) alignment standard by causing each data lane connected to the FPGA and forming part of the SFI channel to be trained independently. In operation, a known short fixed pattern is repeated on each of the data lanes with the exception of the data lane being aligned, and optionally those already aligned. The short fixed pattern is sufficiently smaller than the SERDES capture range so that the deskew engine may temporarily lock onto the short fixed pattern for all data lanes other than the lane being aligned. This masks the out of alignment nature of the other data lanes prior to their alignment. A pseudo-random test pattern or other test pattern is then transmitted on the lane being trained and the preskew value for that lane is adjusted until the receiving component indicates that the data lane skew is acceptable. Optionally, this first process may be initially implemented in a coarse manner, such as in five symbol increments. The process may then adjust the preskew value in smaller increments such as one symbol increments to find the limits on what preskew values are acceptable to the receiving device. A value intermediate the limits on preskew values may then be used as the optimal preskew value for that lane.

Once the optimal preskew value for a particular lane has been found, the preskew values for the other lanes may be determined in the same manner. The known fixed pattern may be transmitted on the previously trained lanes or, alternatively, other data may be transmitted on the previously trained lanes. By training the lanes one at a time and using a short repeating pattern on the untrained lanes, the receiving component will register that the untrained lanes are operating correctly so that the alignment state of a particular lane may be isolated and feedback provided for that one lane rather than for the group of lanes. Each lane may thus be trained independently to enable the outputs of the FPGA to be aligned to comply with the SFI standard.

BRIEF DESCRIPTION OF THE DRAWINGS

Aspects of the present invention are pointed out with particularity in the appended claims. The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures:

FIG. 1 is a functional block diagram of an example communication network over which an embodiment of the invention may operate; and FIG. 2 is a functional block diagram of an optical interface;

DETAILED DESCRIPTION

Figure 3:
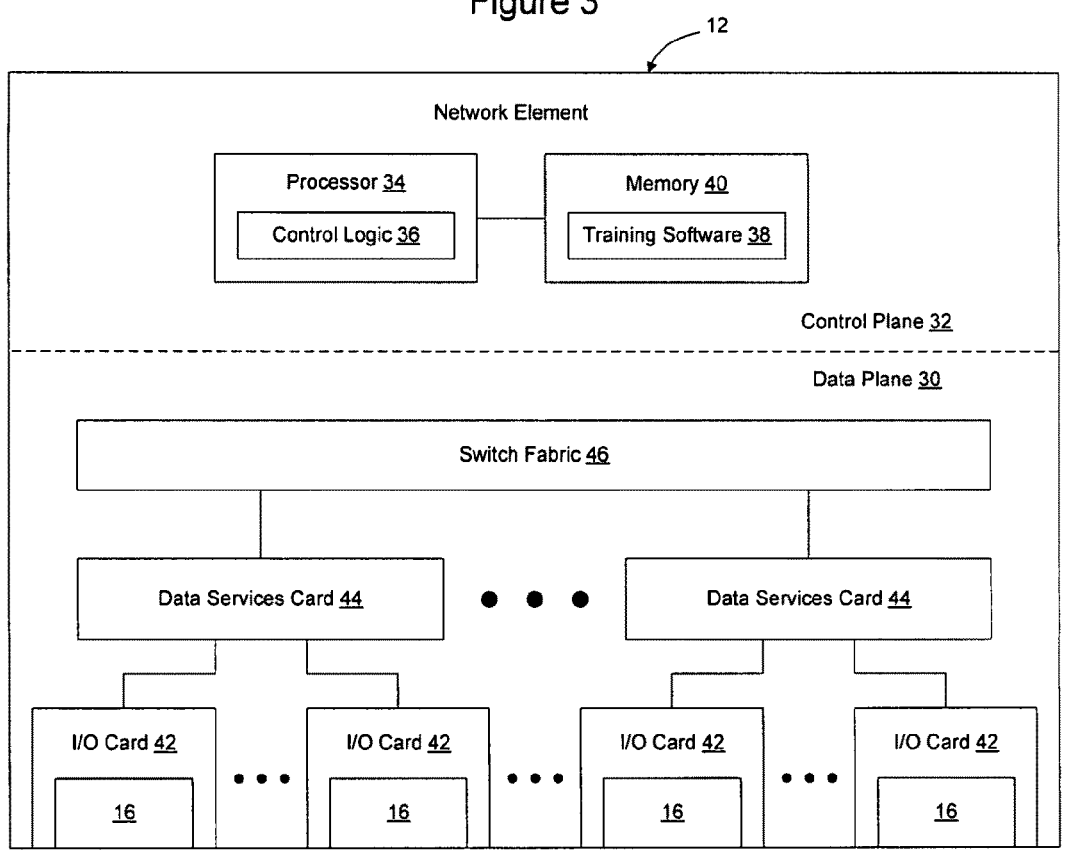
FIG. 3 is a functional block diagram of a network element incorporating optical interfaces configured to operate in accordance with an embodiment of the invention.

The following detailed description sets forth numerous specific details to provide a thorough understanding of the invention. However, those skilled in the art will appreciate that the invention may be practiced without these specific details. In other instances, well-known methods, procedures, components, protocols, algorithms, and circuits have not been described in detail so as not to obscure the invention.

According to an embodiment of the invention, an FPGA may be trained one data lane at a time so that each data lane may be aligned to comply with a particular alignment standard. Once a particular data lane has been aligned, the next data lane is aligned, until all data lanes are aligned. To enable the data lanes to be independently aligned, a short fixed pattern shorter than the receiver capture range is transmitted on the data lanes that are not being trained. The capture range, as used herein, will be used to refer to a range of alignment between the data lane and the deskew lane in which SERDES will be able to find the data on the data lane based on the data transmitted on the deskew lane. Essentially, the SERDES will take the data on the deskew lane and look for the same data on the data lane. It will look for the data forward and backward up to N data symbols, which is referred to herein as the capture range. If the deskew data starts outside of the capture range, the SERDES will not be able to deskew the data lane. If the deskew data starts on the data lane within (+/−) N data unit intervals of the start of the data on the deskew lane, the SERDES will recognize the data and be able to align the data for that data lane.

Because the short fixed pattern is shorter than the receiver capture range, at least one iteration of the deskew data from the deskew lane will be found on the data lane within the receiver capture range, so that the receiver is able to lock onto the data from those data lanes. The particular length of the short fixed pattern to be transmitted may depend on the length of the capture range. The transmission of the short fixed pattern on the unaligned lanes allows the receiver to find an iteration of the deskew data within the capture range on those lanes to make it appear to the receiver that the other lanes that are not being trained or have not been trained are already aligned. Thus, any feedback from the receiver may be associated with the skew value for the lane being trained, which allows the feedback to be specific to a particular lane instead of common to the entire group of lanes. Isolation of the feedback to a particular lane allows the preskew value for the lane being trained to be adjusted until an acceptable skew relative to the deskew channel as seen at the receiver is found.

According to an embodiment of the invention, the process may be used to align outputs of an FPGA-implemented framer to enable the framer to comply with one of the SFI standards. Other optical components may be trained in this manner, however, and the invention is not limited to implementation in an FPGA that is used to implement a framer.

FIG. 3 shows a network element 12 that may be configured to implement an embodiment of the invention. As shown in FIG. 3, the network element includes a data plane 30 and a control plane 32. The data plane is configured to handle traffic on the network 10 and the control plane is configured to control the data plane. Many network element architectures have been developed over the years and the invention is not limited to this particular architecture. In the network element shown in FIG. 3, the control plane 32 includes at least one processor 34 containing control logic 36 that may be programmed using control software 38 stored in memory 40. The control software 38 may be programmed to implement the training processes described herein. The control software may be instantiated as a program in the processor 34 or in another processor, such as a processor resident on one of the data service cards in the data plane 30. Thus, the invention is not limited by the particular manner in which the control process is established to operate on the network element and, indeed, may even be run on a separate network element. The control software may be interfaced with the FPGA in any desired manner to enable the control software to affect operation of the FPGA. Providing control signals to an FPGA is well known and the invention is not limited by the manner in which the FPGA is caused to implement an embodiment of the invention.

Figure 4:
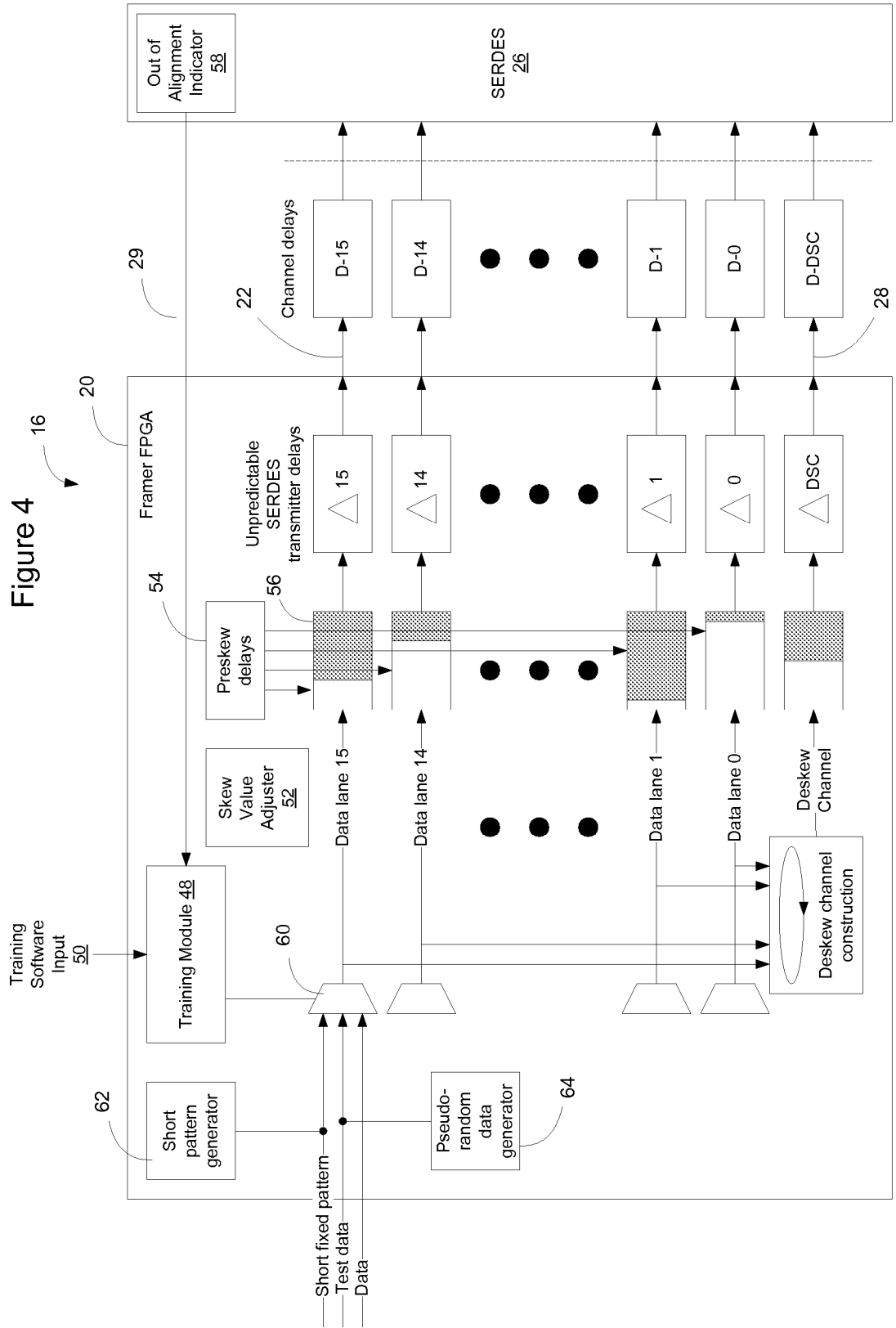
FIG. 4 is a functional block diagram of an optical interface configured to operate in accordance with an embodiment of the invention.

The data plane 30 includes a plurality of Input/Output (I/O) cards 42 containing the optical interfaces 16. The optical interfaces may be implemented as shown in FIG. 4, or may otherwise be implemented to enable an FPGA to transmit data to a SERDES. The SFI standard may be implemented in other contexts as well and the invention is not limited to use in connection with the example interface shown in FIG. 4. The data plane also includes a plurality of data service cards 44, although these may be integrated with the I/O cards if desired. A switch fabric 46 is provided to enable data received on one of the I/O cards to be switched to one or more other I/O cards 42 and/or to the control plane.

FIG. 4 illustrates an example of the optical interface 16 according to an embodiment of the invention, in which the framer 20 has been implemented as an FPGA. Example FPGAs are available from Altera™ and Xilinx™, although other FPGAs may be developed as well and the invention is not limited to use with an FPGA from one of these companies. The FPGA may include a functional module 48 configured to implement the training process described in connection with FIG. 5, or may contain an input 50 via which control signals from the training software 38 may be received. The software 38, in this embodiment, may be configured to interface with the FPGA to cause the FPGA to implement the process described below in connection with FIG. 5. The skew values of the lanes may be individually adjusted on a per-lane basis by the skew value adjuster functional block 52. The skew functional block may implement this by causing the preskew delay values 54 to be set for individual preskew delays 56.

In operation, when the SERDES indicates that the lanes are out of alignment via the out of alignment indicator alarm 29, the training module will cause the data channels 22 to be realigned. This may be implemented, in the illustrated embodiment, by causing the training module to select an input for each data channel via multiplexers 60 so that each data channel is carrying either a short fixed pattern, test data, or regular data as desired. The short fixed pattern may be generated by a short pattern generator 62 on the FPGA or input to the FPGA from an external source. Similarly, the test data may be generated by a pseudo-random data generator 64 on the FPGA or may be input to the FPGA from an external source. Optionally, one or both of the short pattern generator 62 and the pseudorandom data generator may be integrated with the training module 48. The training module will then cause the multiplexers 60 to selectively transmit test data on one lane at a time while transmitting short fixed pattern data on the other lanes to enable the output data channels to be aligned one at a time as described in greater detail herein.

The framer 20 is connected to a SERDES 26 over data channels 22 and deskew channel 28. The SERDES may be implemented using a Multisource Agreement (MSA) 40 Gb/s transponder module or in another manner. Where an MSA transponder is used, the transponder may incorporate the one or both of the FEC processor circuitry 24 and the SERDES circuitry 26. Although an embodiment of the invention will be described in connection with a FPGA implementing a framer that is configured to communicate with a 40 Gb/s transponder, the invention is not limited in this manner as embodiments of the invention may be used to train other devices that are configured to communicate using deserialized data along with an additional lane carrying deskew information in a manner similar to that implemented in the SFI-5 standard. Likewise, although an embodiment will be described in connection with an embodiment that is designed to meet the current SFI standard, the invention is not limited in this manner as the embodiment may also be used or extended to meet future standards should the current standard be revised.

As shown in FIG. 4, each data lane (data lane 15-data lane 0) is provided with an individually adjustable pre-skew delay 56. The preskew delays 56 are set via preskew delay signals 54 which are adjustable via a skew value adjuster 52. Since the delay on a particular data lane will be a combination of an unpredictable/nonuniform transmitter delay plus a nonuniform board delay, the preskew delays 56 may be individually adjusted such that the total delay for each of the data lanes at the SERDES is approximately equal. Thus adjusting the preskew delays may enable the lanes to be aligned upon entry to the SERDES 26 to within the tolerance level specified in the SFI specification. The SERDES may provide feedback to the framer 20 via an out of alignment alarm indication signal 29 transmitted by an out of alignment indicator 58 on the SERDES 26.

Figure 5:
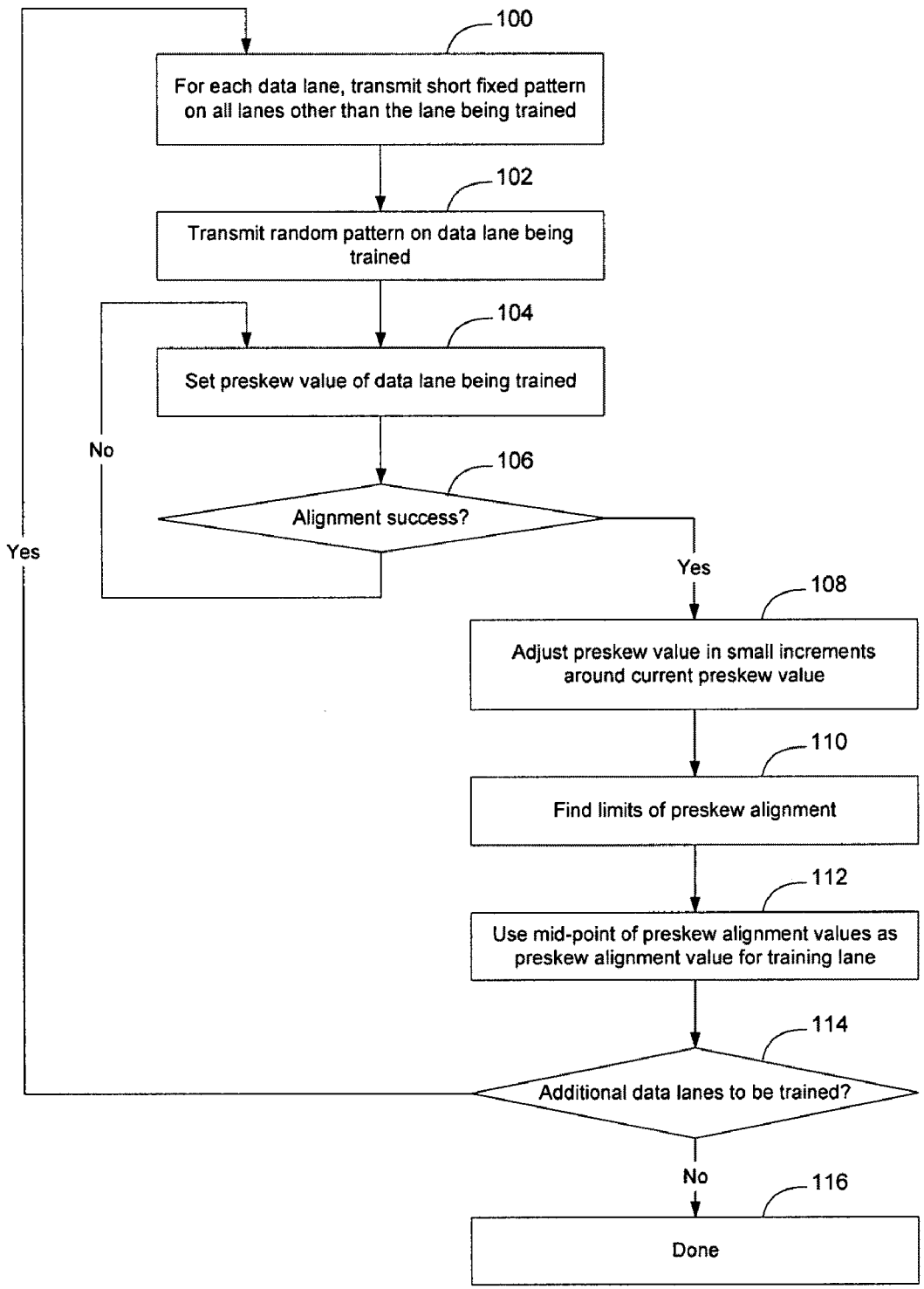
FIG. 5 is a flow diagram of a process that may be used to implement an embodiment of the invention.
Figure 6:
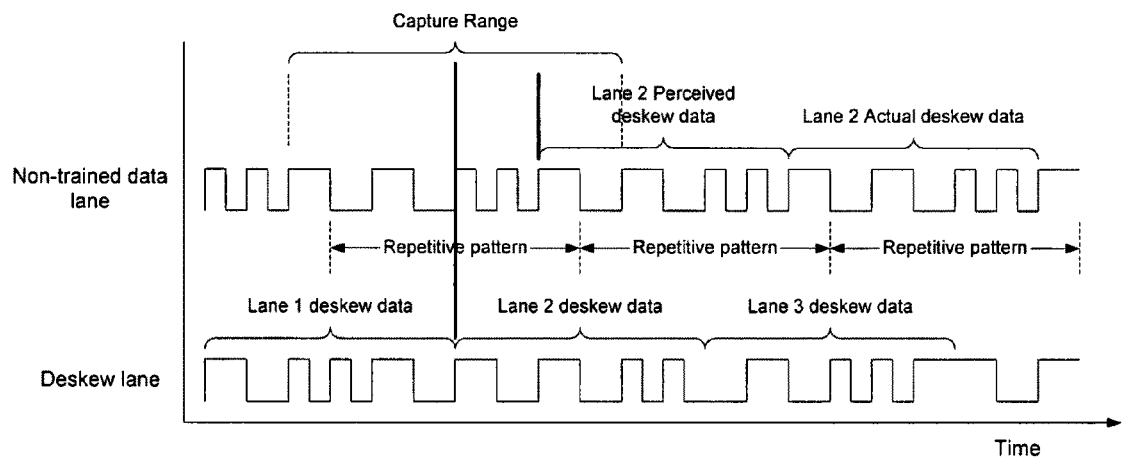
FIG. 6 is an example timing chart illustrating the capture of a short fixed pattern being transmitted on a lane that is not currently being trained.

FIG. 5 shows an example of a process that may be used to implement an embodiment of the invention. As shown in FIG. 5, the interface may be controlled to enable each lane to be trained separately, so that the lanes may be aligned as required by the SFI standard. In the embodiment shown in FIG. 5, the FPGA will transmit a short fixed pattern on all lanes connecting the FPGA and the SERDES other than the lane being aligned (100). The deskew lane will contain replicas of the data lanes in a normal manner. FIG. 6 shows the transmission of data on a lane that is not currently being trained. As shown in FIG. 6, since the FPGA transmits data having a repetitive pattern with a period that is less than or equal to the SERDES capture range, the SERDES will be able to locate one iteration of the transmitted skew data within the capture range. Thus, as shown in FIG. 6, it is irrelevant if the actual data transmitted on the data lane is outside of the capture range of the receiver because at least one other iteration of the short fixed pattern will appear within the capture range. Accordingly, the non-trained lanes will contain some perceived data that is the same as the deskew data to enable the non-trained lanes to appear to the SERDES as if those lanes are properly aligned.

The FPGA will then select one of the lanes to be trained, and transmit training data on the training lane (102). The data to be transmitted may be pseudo-random data, may be a repetitive pattern with relatively longer duration, or data from another source. The invention is not limited by the particular data selected to be transmitted on the training lane. However, to prevent the SERDES from latching onto data that is not the actual deskew data for the training lane, the pattern should be at least longer than the capture range.

The FPGA will set the preskew value of the training lane (104) and wait to receive feedback from the SERDES via the out of alignment alarm 29 to determine whether the SERDES has successfully latched onto the signal (106). The out of alignment alarm is an indication by the SERDES that at least one of the 16 data lanes is out of alignment. Since all lanes other than the training lane are carrying a short repetitive pattern to enable the SERDES to find deskew data within the its capture range, the out of alignment alarm signal may be isolated to relate only to the one lane that is currently being trained. The SERDES will latch onto the signal when it finds the deskew data within its capture range for a predetermined number of cycles. If the SERDES does not latch onto the data, the preskew value of the FPGA may be adjusted for the training lane. This process will iterate until the SERDES reports alignment success or fails to indicate that the lanes are out of alignment.

Depending on the particular manner in which the preskew values are adjusted, the process may then proceed to adjust the preskew value for the training lane further to determine the limits of acceptable preskew values in order to center the lane within the receiver's skew tolerance. For example, as shown in FIG. 5, the preskew value may initially be incremented in relatively large increments and, once an acceptable preskew value has been determined, the preskew value may be adjusted in smaller increments around that first found preskew value (108). By adjusting the skew values at the FPGA in small increments, it is possible to find the limits of the acceptable preskew values that will enable the data lane to be aligned at the SERDES (110). The mid-point between the maximum and minimum preskew values (112), or another selected value, may then be used as a final preskew value for the lane that is being trained. Once one lane has been trained, the process will iterate to train the other lanes (114) until all lanes have been individually trained. When the FPGA is trained, the training process is done (116) and the SFI bus may be used to transmit data from the FPGA to the SERDES. Within the FPGA, a preskew value adjustment module 52 may be used to set and adjust the preskew values 54 for the data lanes that are used to transmit the data from the FPGA.

Figure 7:
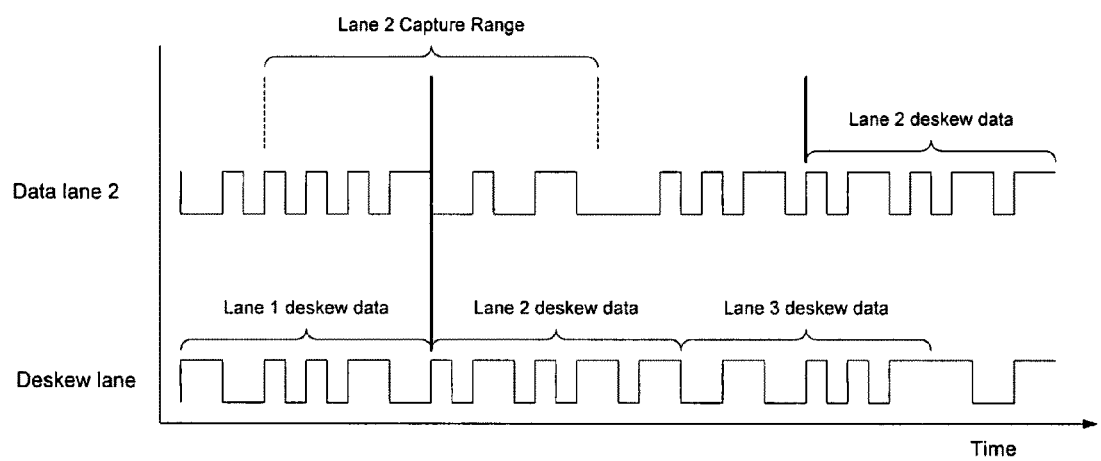
FIGS. 7-9 provide example timing charts illustrating the effect of adjusting a preskew value of a data lane to enable the data lane to be aligned according to an embodiment of the invention.
Figure 8:
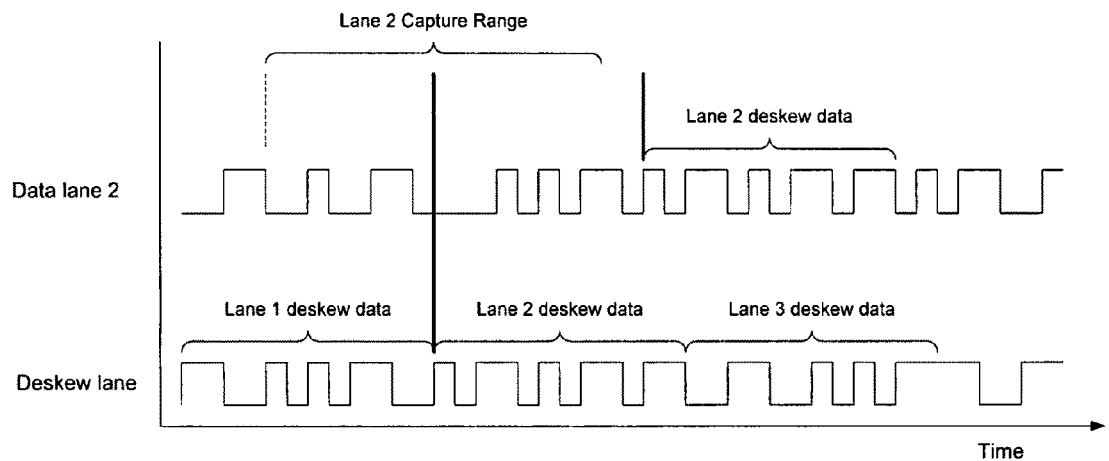
Figure 9:
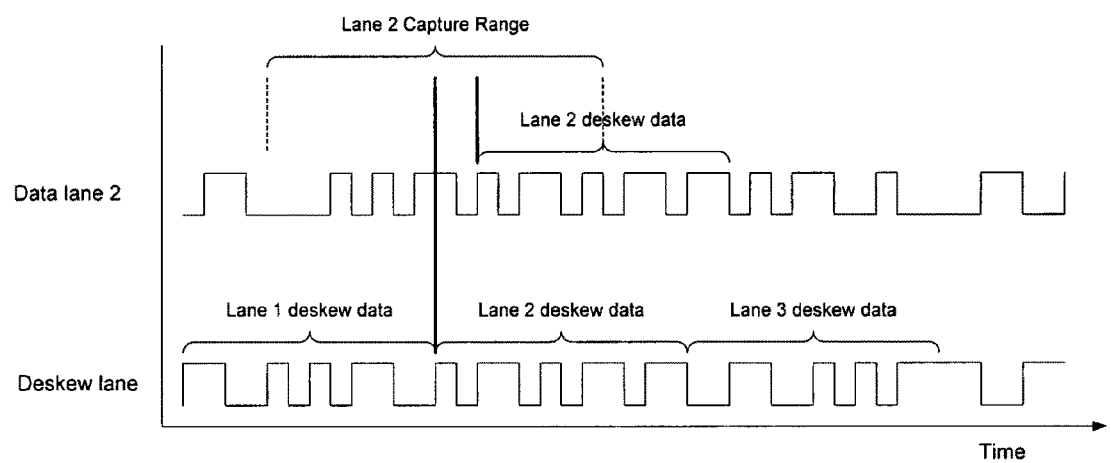

FIGS. 7-9 illustrate graphically how a data lane (lane 2 is used as an example in FIGS. 7-9) may be out of alignment with the deskew channel, and how adjusting the preskew value for that lane may cause the data lane to be aligned. Assume, as shown in FIG. 7, that the SERDES has a capture range as shown, and that the SERDES therefore will be looking to find the deskew data on the data lane within +/− N unit intervals of the start of the deskew data for that lane on the deskew lane. The deskew data is a contiguous segment of data that is sampled from the actual data being transmitted on the lane that is being trained, and also includes data from other channels. Specifically, the deskew channel contains a short data sample from each data channel, so that the single deskew channel may be used to check alignment of all 16 data channels. If the SERDES is not able to find the expected deskew data on the data lane within the specified capture range, the SERDES knows that the training lane is seriously out of alignment with the deskew lane and that the preskew (aka delay) associated with the lane is incorrect. By adjusting the preskew delay value 56 for that lane, the total delay for the data lane may be adjusted so that the data arrives on the data lane closer in time to when the data for that data lane arrives on the deskew lane. Thus, the preskew delay value 56 may be used to adjust the alignment of the data lane at the SERDES.

In the example shown in FIG. 7, the delay on the data lane being trained (lane 2 in FIG. 7) is too large since the deskew data that was sampled for transmission on the deskew lane was transmitted, arrived at the receiver, and the resultant capture range closed, before the sampled data arrived on the data lane. To advance the lane and move the data on the lane more into alignment, the preskew delay on the lane being trained may be adjusted (decreased in this instance) to cause the deskew data to be located closer to the capture range of the SERDES.

In FIG. 8, the preskew delay value for the data lane being trained (lane 2 in FIG. 8) is adjusted to decrease the delay associated with that training lane. This will cause the data that was sampled and transmitted on the data lane to be received at a time closer to the replica data on the deskew channel so that the data moves closer to the capture range of the SERDES. However, the preskew value is still not quite acceptable in FIG. 8 and, accordingly, the SERDES will indicate that the channel is out of alignment.

In FIG. 9, the preskew value for the lane being trained (lane 2 in FIG. 8) has been adjusted (decreased further) so that the data that was transmitted on the deskew lane is received within N unit intervals on the data lane. Since the data lane is thus transmitting the preskew data within the capture range of the preskew lane, the SERDES is now able to complete deskew of this data lane and bring it into alignment with the deskew channel and all other previously deskewed lanes. When this occurs, the SERDES may either report that the lanes are aligned or stop reporting that the lanes are out of alignment.

Currently available FPGAs have skew variations of up to 40 unit intervals, such that the delay associated with a given transmission lane may be time-misaligned by up to 40 unit intervals relative to other data lanes. Since the SFI-5 standard requires the 16 lanes to all be aligned to within 5 unit intervals of each other, a requirement is to adjust the skew of each of the lanes so that the all of the data lanes are aligned to comply with the SFI-5 standard. The manner in which the skew values are selected (see block 104 of FIG. 5) may be optimized to accelerate finding a value where the lane being trained indicates initial success. For example, the initial value may be selected to be several unit intervals from one end of the possible adjustment range and then the preskew value may be incremented or decremented by five unit intervals each time the skew value is adjusted (104). Other ways of adjusting the preskew values may be used as well and the invention is not limited to this particular described implementation. Although the SFI-5 standard is used as an example, the described procedure can be used in any instance in which there is a requirement to implement a data stream with an alignment tolerance exceeding the capability of a transmitting device, and where only a global skew misalignment signal is provided such that the skew information for individual lanes is not available.

Depending on the particular implementation, it may be necessary to clear the out of alignment alarm 29 before training of the lanes may occur. Accordingly, to quickly clear the alarm, in one embodiment, the short repetitive pattern may initially be transmitted on all data channels to cause the SERDES to initially latch onto the signals being transmitted on all lanes. In this embodiment, once the SERDES has latched onto the short repetitive pattern in each of the data channels, training of the data channels may occur as described in greater detail herein.

The functions described above may be implemented as a set of program instructions that are stored in a computer readable memory associated with one or more processors such as the processors 34 in the control plane or a processor implemented on one of the data service cards in the data plane. However, it will be apparent to a skilled artisan that all logic described herein can be embodied using discrete components, integrated circuitry such as an Application Specific Integrated Circuit (ASIC), programmable logic used in conjunction with a programmable logic device such as a Field Programmable Gate Array (FPGA) or microprocessor, a state machine, or any other device including any combination thereof. Programmable logic can be fixed temporarily or permanently in a tangible medium such as a read-only memory chip, a computer memory, a disk, or other storage medium. Programmable logic can also be fixed in a computer data signal embodied in a carrier wave, allowing the programmable logic to be transmitted over an interface such as a computer bus or communication network. All such embodiments are intended to fall within the scope of the present invention.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of aligning communication lanes interconnecting a transmitting device and a receiving device, the method comprising the steps of:
    transmitting a training data on a first of the communication lanes by the transmitting device;
    transmitting a short repetitive pattern on at least a second of the communication lanes by the transmitting device, the short repetitive pattern being shorter than a capture range of the receiving device;
    transmitting deskew data, the deskew data including a portion of the training data from the first communication lane and a portion of the short repetitive pattern from the second communication lane; and
    adjusting a preskew value at the transmitting device of the first communication lane until a feedback signal from the receiving device indicates that the communication lanes being trained are aligned, the feedback signal being a collective feedback signal indicative as to whether the plurality of communication lanes have been aligned;
    wherein transmission of the portion of the short repetitive pattern enables the receiver to find a start of the deskew data from the second communication lane within the capture range on the second communication lane, to cause the receiver to determine that the second of the communication lanes is aligned.

2. The method of claim 1, wherein the step of transmitting a short repetitive pattern comprises transmitting a short repetitive pattern on at least all of the remaining unaligned communication lanes.

3. The method of claim 1, farther comprising the step of iterating the process for other communication lanes until all of the communication lanes are aligned.

4. The method of claim 1, wherein the second of the communication lanes is not aligned while transmitting the training data for the first communication lane.

5. The method of claim 1, wherein the preskew value is a delay value associated with a delay of the first communication lane.

6. The method of claim 1, wherein the communication lanes are implementing one of the SERDES-Framer Interface (SFI) standards.

7. The method of claim 1, further comprising the step of initially transmitting the short repetitive pattern on all of the communication lanes to cause the feedback signal from the receiving device to artificially initially indicate that all communication lanes are aligned.

8. A Field Programmable Gate Array (FPGA), comprising:
    gate logic configured to implement a plurality of data lanes, an individually adjustable preskew delay for each said data lane, a feedback channel via which an alignment indication of all data lanes may be received, and a skew value adjuster via which the preskew delay for each data lane may be individually adjusted;
    gate logic configured to enable the FPGA to isolate one of the data lanes for alignment by causing training data for the isolated data lane to be transmitted on the isolated data lane and causing a short fixed pattern to be transmitted on at least all unaligned data lanes,
    the short repetitive pattern being shorter than a capture range of a receiving device enabling the receiver to find a start of the deskew data on the other unaligned data lanes within the capture range for those data lanes, to cause the receiver to artificially determine that the other unaligned data lanes are aligned;
    gate logic configured to transmit deskew data, the deskew data including a portion of the training data to be used to align the isolated data lane as well as portions of the short repetitive pattern for each of the other unaligned data lanes;
    gate logic configured to adjust the preskew value of the isolated data lane until a feedback signal from the receiving device indicates that the communication lanes are aligned, the feedback signal being a collective feedback signal indicative as to whether the plurality of communication lanes have been aligned.

9. The FPGA of claim 8, further comprising gate logic configured to construct a deskew channel containing a segment of data from each of the data lanes.

10. The FPGA of claim 8, further comprising gate logic configured to implement a training module to enable the FPGA to serially isolate the data lanes for alignment.

11. The FPGA of claim 8, further comprising an input configured to enable the FPGA to receive instructions to cause the FPGA to serially isolate the data lanes for alignment.

12. The FPGA of claim 8, wherein the FPGA is further configured to implement one of the SERDES-Framer Interface (SFI) standards.

13. The FPGA of claim 8, wherein the FPGA has sate logic configured to implement 16 data lanes.

14. The FPGA of claim 13, wherein the FPGA further comprises at least one multiplexer having an output connected to one of the 16 data lanes, a first input connected to a short pattern data source, a second input connected to a pseudorandom data source; and a third input connected to a data source.

15. The FPGA of claim 13, wherein the gate logic configured to enable the FPGA to isolate one of the data lanes for alignment is configured to initially cause the short fixed pattern to be transmitted on all 16 of the data lanes to clear the alignment indication from the feedback channel.

* * * * *